United States Patent
Murakami et al.

(10) Patent No.: US 10,727,150 B2
(45) Date of Patent: Jul. 28, 2020

(54) SEMICONDUCTOR MODULE AND POWER CONVERTER

(71) Applicant: Mitsubishi Electric Corporation, Tokyo (JP)

(72) Inventors: Haruhiko Murakami, Tokyo (JP); Rei Yoneyama, Tokyo (JP); Takami Otsuki, Tokyo (JP); Akihiko Yamashita, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/453,966

(22) Filed: Mar. 9, 2017

(65) Prior Publication Data

US 2018/0019180 A1 Jan. 18, 2018

(30) Foreign Application Priority Data

Jul. 12, 2016 (JP) .................................. 2016-137730

(51) Int. Cl.
*H01L 23/36* (2006.01)
*H01L 23/367* (2006.01)
(Continued)

(52) U.S. Cl.
CPC .......... *H01L 23/3675* (2013.01); *H01L 23/04* (2013.01); *H01L 23/053* (2013.01);
(Continued)

(58) Field of Classification Search
CPC ... H01L 23/3735; H01L 23/367; H01L 24/32; H01L 24/495; H01L 23/3675; H01L 2224/48106
See application file for complete search history.

(56) References Cited

U.S. PATENT DOCUMENTS 6,534,723 B1 * 3/2003 Asai .................. H01L 23/49811
174/255
2002/0132094 A1 * 9/2002 Takeuchi ................ B32B 15/08
428/209
(Continued)

FOREIGN PATENT DOCUMENTS

DE 10 2008 052 029 A1 6/2009
JP 2014-130875 A 7/2014
(Continued)

OTHER PUBLICATIONS

An Office Action mailed by the State Intellectual Property Office of the People's Republic of China dated Aug. 2, 2019, which corresponds to Chinese Patent Application No. 201710565919.9 and is related to U.S. Appl. No. 15/453,966; with English language translation.

(Continued)

*Primary Examiner* — Charles D Garber
*Assistant Examiner* — S M Sohel Imtiaz
(74) *Attorney, Agent, or Firm* — Studebaker & Brackett PC

(57) ABSTRACT

A semiconductor module includes an insulating substrate including an insulating layer, a first metal pattern formed on an upper surface of the insulating layer, and a second metal pattern formed on a lower surface of the insulating layer, a semiconductor chip that is formed of SiC and is fixed to the first metal pattern with a first metal joining member, and a heat sink that is fixed to the second metal pattern with a second metal joining member, wherein the semiconductor chip has a thickness that is equal to or larger than 0.25 mm and equal to or smaller than 0.35 mm, and the insulating layer has a thickness that is larger than the thickness of the semiconductor chip by a factor of 2.66 inclusive to 5 inclusive.

4 Claims, 5 Drawing Sheets

(51) Int. Cl.
  *H01L 23/053* (2006.01)
  *H01L 23/00* (2006.01)
  *H01L 23/04* (2006.01)
  *H01L 23/373* (2006.01)
  *H02M 7/537* (2006.01)

(52) U.S. Cl.
  CPC .......... *H01L 23/36* (2013.01); *H01L 23/3735* (2013.01); *H01L 24/00* (2013.01); *H01L 24/32* (2013.01); *H02M 7/537* (2013.01); *H01L 24/48* (2013.01); *H01L 24/49* (2013.01); *H01L 2224/32245* (2013.01); *H01L 2224/48091* (2013.01); *H01L 2224/48106* (2013.01); *H01L 2224/48175* (2013.01); *H01L 2224/48245* (2013.01); *H01L 2224/73265* (2013.01); *H01L 2924/05032* (2013.01); *H01L 2924/05042* (2013.01); *H01L 2924/05432* (2013.01); *H01L 2924/10272* (2013.01); *H01L 2924/1203* (2013.01); *H01L 2924/13055* (2013.01); *H01L 2924/13091* (2013.01); *H01L 2924/1425* (2013.01); *H01L 2924/1426* (2013.01); *H01L 2924/3512* (2013.01)

(56) References Cited

U.S. PATENT DOCUMENTS

| | | | |
|---|---|---|---|
| 2009/0140399 A1 | 6/2009 | Schulz et al. | |
| 2010/0212942 A1* | 8/2010 | Tuan | H01L 23/3735 174/257 |
| 2011/0057713 A1 | 3/2011 | Kawanami et al. | |
| 2011/0180809 A1 | 7/2011 | Hino et al. | |
| 2012/0256224 A1* | 10/2012 | Hatanaka | C23C 18/1608 257/98 |
| 2012/0261811 A1* | 10/2012 | Nakanishi | H01L 23/3735 257/712 |
| 2013/0134572 A1* | 5/2013 | Lenniger | H01L 23/367 257/690 |
| 2013/0182470 A1 | 7/2013 | Chen et al. | |
| 2013/0240909 A1 | 9/2013 | Hiramatsu et al. | |
| 2014/0198454 A1* | 7/2014 | Yuan | H05K 7/209 361/720 |
| 2014/0246783 A1* | 9/2014 | Nishizawa | H01L 25/072 257/774 |
| 2015/0055302 A1* | 2/2015 | Nagatomo | B32B 9/005 361/709 |
| 2015/0115288 A1* | 4/2015 | Tamada | H01L 23/3107 257/77 |
| 2015/0116945 A1* | 4/2015 | Minamio | H01L 23/4006 361/709 |
| 2015/0130085 A1 | 5/2015 | Hino | |
| 2015/0255358 A1* | 9/2015 | Wen | H01L 21/268 257/738 |
| 2015/0287665 A1* | 10/2015 | Hanada | H01L 25/115 257/691 |
| 2016/0254255 A1* | 9/2016 | Hori | H01L 24/16 257/685 |

FOREIGN PATENT DOCUMENTS

| | | |
|---|---|---|
| JP | 2015095540 A | 5/2015 |
| JP | 2015-142063 A | 8/2015 |
| JP | 2015-220295 A | 12/2015 |
| WO | 2014030659 A1 | 2/2014 |

OTHER PUBLICATIONS

An Office Action mailed by the Japanese Patent Office dated Aug. 20, 2019, which corresponds to Japanese Patent Application No. 2016-137730 and is related to U.S. Appl. No. 15/453,966; with English translation.

An Office Action mailed by the Japanese Patent Office dated Mar. 10, 2020, which corresponds to Japanese Patent Application No. 2016-137730 and is related to U.S. Appl. No. 15/453,966; with English language translation.

An Office Action mailed by the State Intellectual Property Office of the People's Republic of China dated Apr. 28, 2020, which corresponds to Chinese Patent Application No. 201710565919.9 and is related to U.S. Appl. No. 15/453,966; with English language translation.

An Office Action mailed by the German Patent Office dated May 18, 2020, which corresponds to German Patent Application No. 10 2017 209 119.3 and is related to U.S. Appl. No. 15/453,966.

* cited by examiner

SEMICONDUCTOR MODULE AND POWER CONVERTER

BACKGROUND OF THE INVENTION

Field of the Invention

The present invention relates to a semiconductor module used for, for example, switching high current or for the other like purposes, and a power converter using the semiconductor module.

Background Art

Japanese laid-open patent publication No. 2014-130875 discloses an insulating substrate including a ceramic plate and electrodes formed on upper and lower surfaces of the ceramic plate. A base plate is fixed to one of the electrodes with a metal joining member, and a semiconductor device is fixed to the other one of the electrodes with a metal joining member.

A semiconductor module used for power control has a semiconductor chip mounted thereon. Such a semiconductor chip includes an insulated gate bipolar transistor (IGBT), a metal-oxide silicon field effect transistor (MOSFET), and a freewheeling diode (FWDi). This semiconductor module is known as a power module. The power module includes: an insulating substrate soldered on a heat sink; and a semiconductor chip soldered on a metal pattern on the insulating substrate.

An inverter device, as a product employing the power module, is required to achieve lower loss and to be downsized. Logically, the semiconductor module is also required to achieve lower loss and to be downsized. The lower loss can be achieved with a thinner semiconductor chip and an optimized semiconductor chip structure. The downsizing is achieved with an optimized package structure. However, in the downsized semiconductor module, semiconductor chips are densely arranged to make a heat dissipation area small. Thus, the heat dissipation might be compromised. The insulating substrate may have a thinner insulating layer to prevent the heat dissipation from compromising.

Thus, there is a recent trend that the semiconductor chips are designed to be thinner to achieve the semiconductor module with lower loss, and that the insulating layer of the insulating substrate is designed to be thinner for achieving higher heat dissipation.

The semiconductor chips and the insulating substrate are joined together with first solder. The insulating substrate and the heat sink are joined together with second solder. When the semiconductor module is used to operate in a pattern involving a large difference between joining temperature for the semiconductor chips and casing temperature, the difference among the semiconductor chips, the insulating substrate, and the heat sink in a linear expansion coefficient causes thermal fatigue in the first solder and the second solder. The thermal fatigue might lead to a crack in the first solder and the second solder that leads to the degradation of the heat dissipation, resulting in a shorter service life.

The first solder receives large stress strain due to temperature change, when the semiconductor chip is formed of a material such as SiC with a physical property of being harder than Si. The stress strain on the first solder becomes even larger when the insulating layer is thin to lead to a shorter service life of the semiconductor module.

The semiconductor chips may be designed to be thinner to reduce stress strain on the first solder. Unfortunately, thinning of a wafer made of SiC, a harder material than Si, involves heavy wearing of a polishing tool used, leading to low mass production efficiency.

SUMMARY OF THE INVENTION

The present invention is made in view of the situation described above, and an object of the present invention is to provide a semiconductor module and a power converter in which high heat dissipation can be ensured for semiconductor chips.

The features and advantages of the present invention may be summarized as follows.

According to one aspect of the present invention, a semiconductor module includes an insulating substrate including an insulating layer, a first metal pattern formed on an upper surface of the insulating layer, and a second metal pattern formed on a lower surface of the insulating layer, a semiconductor chip that is formed of SiC and is fixed to the first metal pattern with a first metal joining member, and a heat sink that is fixed to the second metal pattern with a second metal joining member. The semiconductor chip has a thickness that is equal to or larger than 0.25 mm and equal to or smaller than 0.35 mm, and the insulating layer has a thickness that is larger than the thickness of the semiconductor chip by a factor of 2.66 inclusive to 5 inclusive.

Other and further objects, features and advantages of the invention will appear more fully from the following description.

DETAILED DESCRIPTION OF THE PREFERRED EMBODIMENTS

Figure 1:
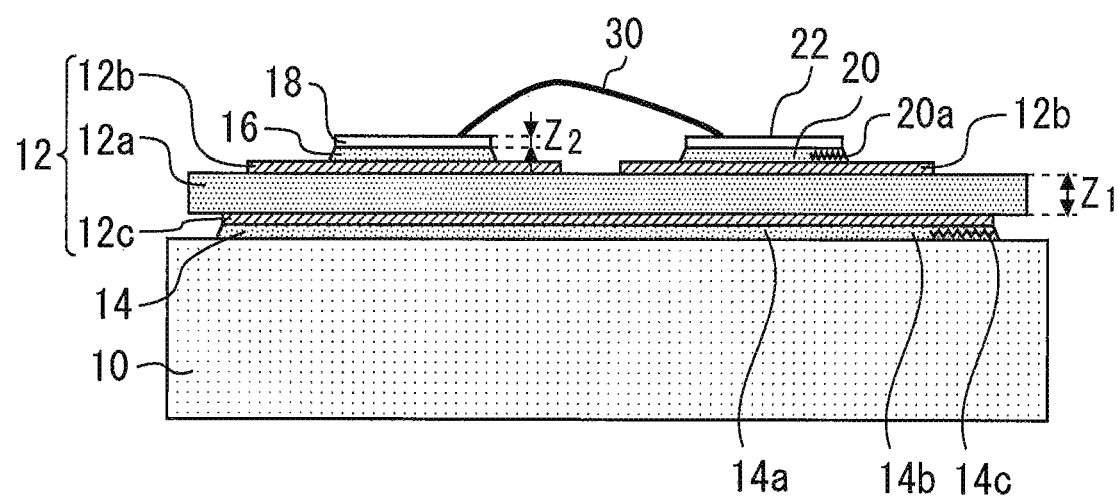
FIG. 1 is a cross-sectional view of a semiconductor module according to first embodiment.

Semiconductor modules and a power converter according to embodiments of the present invention are described with reference to the drawings. The same or corresponding components are denoted with the same reference numerals, and a redundant description may be omitted as appropriate.

First Embodiment

FIG. 1 is a cross-sectional view of a semiconductor module according to first embodiment. The semiconductor module includes an insulating substrate 12. The insulating substrate 12 includes: an insulating layer 12a; a first metal pattern 12b formed on an upper surface of the insulating layer 12a; and a second metal pattern 12c formed on a lower surface of the insulating layer 12a. A material of the insulating layer 12a is for example AlN, $Al_2O_3$, or SiN.

Semiconductor chips 18 and 22 are fixed on the first metal pattern 12b with first metal joining members 16 and 20. The semiconductor chips 18 and 22 are formed of SiC. For example, the semiconductor chip 18 is an Insulated Gate Bipolar Transistor (IGBT), and the semiconductor chip 22 is a freewheeling diode. Generally, semiconductor chips or wafers formed of SiC are designed to have a thickness of 0.25 mm to 0.35 mm. For example, an n-type SiC wafer having a thickness of 350 μm is disclosed in the paragraph 0005 in Japanese laid-open patent publication No. 2014-82361. The semiconductor chips 18 and 22 of the semiconductor module according to first embodiment of the present invention each have a thickness Z2 that is equal to or larger than 0.25 mm and equal to or smaller than 0.35 mm.

A heat sink 10 is fixed to a second metal pattern 12c with a second metal joining member 14. The heat sink 10 is formed of a material featuring high heat dissipation such as metal. For example, the first metal joining members 16 and 20 and the second metal joining member 14 are solders. The second metal joining member 14 includes: directly below portions 14a disposed directly below the semiconductor chips 18 and 22; and a non-directly below portion 14b that continues to the directly below portions 14a and is not disposed directly below the semiconductor chips 18 and 22. An area where the second metal joining member 14 is formed is larger than an area where each of the first metal joining members 16 and 20 is formed.

The insulating layer 12a and the semiconductor chips 18 and 22 satisfy the following relationship in terms of a physical property and a linear expansion coefficient. More specifically, the thicker insulating layer 12a leads to smaller strain on the first metal joining members 16 and 20 below the semiconductor chips 18 and 22 and to larger strain on the second metal joining member 14 below the insulating substrate 12. Such a relationship is also satisfied in general cases other than a case where the insulating layer 12a is formed of AlN and the semiconductor chips 18 and 22 are formed of SiC.

When the portions of the semiconductor module repeatedly expand and contract in a heat cycle, a crack is formed in an end portion of each of the first metal joining members 16 and 20, and in an end portion of the second metal joining member 14. FIG. 1 illustrates a crack 20a formed in the first metal joining member 20 and a crack 14c formed in the second metal joining member 14.

Figure 2:
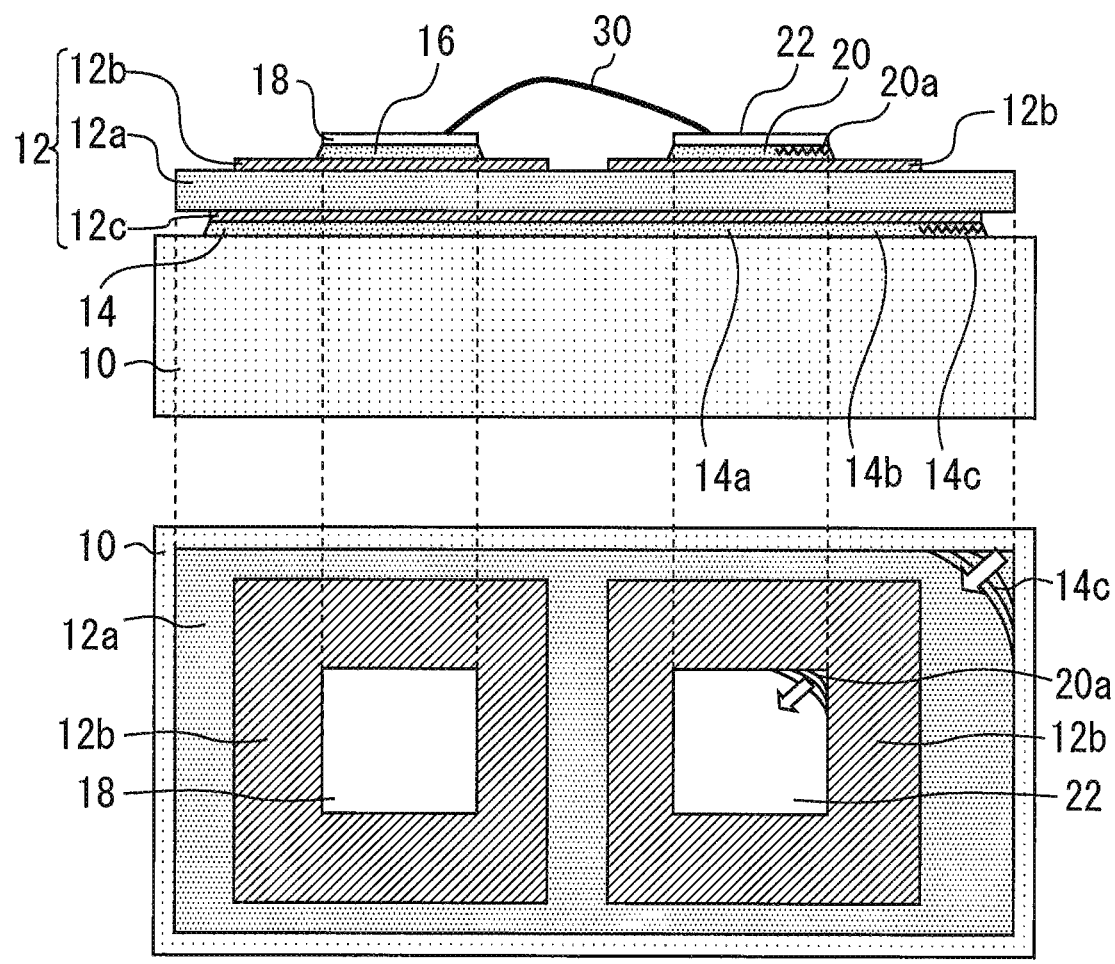
FIG. 2 is a cross-sectional view and a plan view of the semiconductor module.

FIG. 2 is a cross-sectional view and a plan view of the semiconductor module. In FIG. 2, the crack 14c formed in the second metal joining member 14 and the crack 20a formed in the first metal joining member 20 are illustrated for the sake of description. The crack 20a on the first metal joining member 20 directly leads to the degradation of the heat dissipation for the semiconductor chip 22. The crack 14c formed in the second metal joining member 14 is formed in the non-directly below portion 14b and thus is less likely to negatively impact the heat dissipation for the semiconductor chip 22.

The sizes of the cracks 20a and 14c can be controlled with the thickness of the insulating layer 12a as described above. In first embodiment of the present invention, the insulating layer 12a has a thickness Z1 larger than the thickness Z2 of each of the semiconductor chips 18 and 22 by a factor of 2.66 inclusive to 5 inclusive. Thus, the insulating layer 12a is designed to be thick so that the crack decreases in the first metal joining members 16 and 20 below the semiconductor chips 18 and 22, and increases in the second metal joining member 14 below the insulating substrate 12.

Thus, the crack is prevented from being formed in the first metal joining members 16 and 22 so as not to largely degrade the heat dissipation for the semiconductor chips 18 and 20, but is formed in the non-directly below portion 14b of the second metal joining member 14 because the crack formed in such a portion is less likely to adversely affect the heat dissipation for the semiconductor chips 18 and 20. Thus, high heat dissipation can be ensured for the semiconductor chips. The crack is likely to be formed in the first metal joining members 16 and 20 especially when the semiconductor chips 18 and 20 are made of a hard material such as SiC. All things considered, with the formation of the crack controlled as described above, the crack formed in the first metal joining members 16 and 20 due to the thermal fatigue can be prevented or reduced.

As described above, in the semiconductor module according to first embodiment of the present invention, the cracks formed in the first metal joining members 16 and 20 are smaller than the crack formed in the second metal joining member 14. Thus, a relatively large crack is formed in the second metal joining member 14. Still, the semiconductor chips 18 and 20 are formed at center portions of the insulating substrate 12 in plan view. Thus, the crack may be formed in the non-directly below portion 14b but is not formed in the directly-below portion 14a. All things considered, the heat dissipation for the semiconductor chips 18 and 22 is not largely compromised.

The insulating substrate 12 with the semiconductor chips 18 and 20 formed of SiC can withstand high current and thus is designed to be large. With such a design, the non-directly below portion 14b of the second metal joining member 14 has a large area, and thus the crack formed in the non-directly below portion 14b is less likely to reach the directly below portion 14a.

The semiconductor module according to first embodiment of the present invention can be modified in various ways without compromising the feature described above. For example, any number of semiconductor chips may be fixed on the insulating substrate 12. The same applies to semiconductor modules and a power converter according to embodiments described below. The semiconductor modules and the power converter according to the embodiments described below are similar to those according to first embodiment, and thus their differences from first embodiment are mainly described.

Second Embodiment

Figure 3:
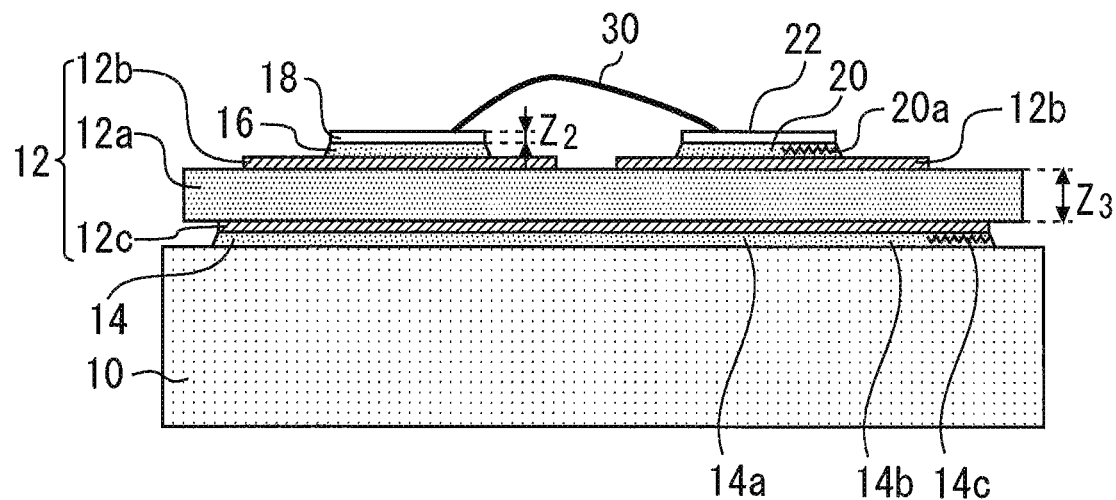
FIG. 3 is a cross-sectional view of a semiconductor module according to second embodiment.
Figure 4:
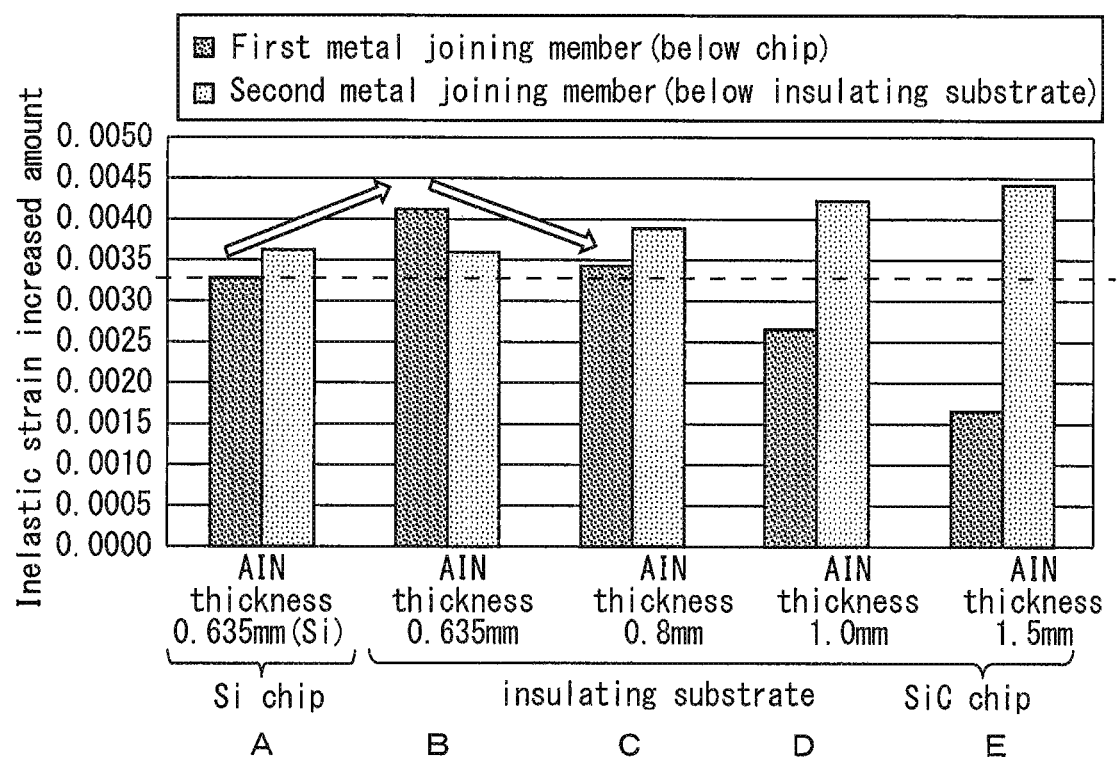
FIG. 4 is a diagram illustrating a relationship between the thickness of the insulating layer and the strain on the first metal joining members and the second metal joining member.

FIG. 3 is a cross-sectional view of a semiconductor module according to second embodiment. The thickness Z2 of the semiconductor chip is equal to or larger than 0.25 mm and equal to or smaller than 0.35 mm. The thickness Z3 of the insulating layer 12a is equal to or larger than 0.8 mm. FIG. 4 is a diagram illustrating a relationship between the thickness of the insulating layer 12a formed of AlN and the strain on the first metal joining members 16 and 20 and the second metal joining member 14. A section A in FIG. 4 illustrates inelastic strain on the first metal joining members 16 and 20 and the second metal joining member 14 under a condition where the semiconductor chip is formed of Si and the insulating layer AlN has a thickness of 0.653 mm, as a reference of an increased amount.

Here, the larger strain acts on the second metal joining member 14 below the insulating substrate 12 than on the first metal joining members 16 and 20. However, when the semiconductor chip is formed of SiC as illustrated in a section B in FIG. 4, larger strain acts on the first metal joining members 16 and 20 below the semiconductor chips, even when the thickness of the insulating layer 12a formed of AlN is unchanged from 0.653 mm. This is because SiC is a material harder than Si. As described above, when the semiconductor chip is formed of SiC, a large strain is likely to act on the first metal joining members 16 and 20.

As illustrated in sections C, D, and E in FIG. 4, the strain on the first metal joining members 16 and 20 decreases and the strain on the second metal joining member 14 increases, as the thickness of the insulating layer 12a increases to 0.8 mm, 1.0 mm, and 1.5 mm. In second embodiment of the present invention, the thickness Z3 of the insulating layer 12a is not smaller than 0.8 mm. Thus, the strain on the first metal joining members 16 and 20 is always smaller than the strain on the second metal joining member 14. In other words, the strain on the first metal joining members 16 and 20 does not overwhelm that in a case where the insulating layer is formed of Si as illustrated in the section A in FIG. 4. All things considered, high heat dissipation can be ensured for the semiconductor chip.

Third Embodiment

Figure 5:
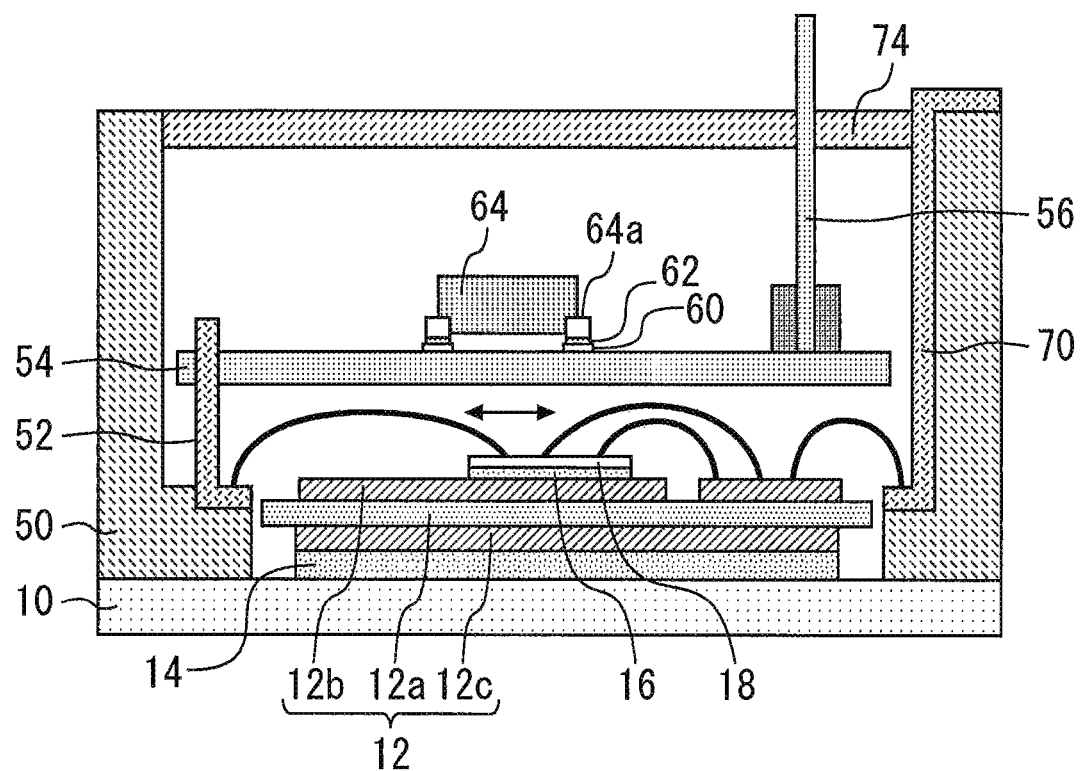
FIG. 5 is a cross-sectional view of a semiconductor module according to third embodiment.

FIG. 5 is a cross-sectional view of a semiconductor module according to third embodiment. The insulating substrate 12 and the semiconductor chip 18 are accommodated in a casing 50. The casing 50 is fixed on the heat sink 10. A terminal 52 is fixed on the casing 50. A printed circuit board 54 is fixed on the terminal 52. The printed circuit board 54 is disposed directly above the insulating substrate 12 in the casing 50. Lands 60 of a conductive material are formed on the printed circuit board 54. Terminals 64a of a control integrated circuit (IC) 64 is fixed on the lands 60 with solder 62. In the control IC 64, a driving circuit that drives the semiconductor chip 18 and a protection circuit for the semiconductor chip 18 are integrated. The control IC 64 is accommodated in the casing 50.

A terminal 56 extending out of the casing 50 is connected to the printed circuit board 54. The terminal 56 functions as a signal terminal. A main terminal 70 extending out of the casing 50 is fixed to the casing 50. A lid 74 is attached to the casing 50. This semiconductor module with the casing 50 incorporating the control IC 64 in which the driving circuit and the protection circuit for the semiconductor chip 18 are integrated is referred to as an intelligent power module (IPM). The IPM is required to be more downsized than semiconductor modules. When the chips are densely arranged due to the downsizing of the package, heat density in the IPM becomes high, and thus the chip joining temperate largely changes while the IPM is under operation. In such a situation, the configuration described in first or second Embodiment may be employed so that high heat dissipation can be ensured for the semiconductor chip.

Fourth Embodiment

Figure 6:
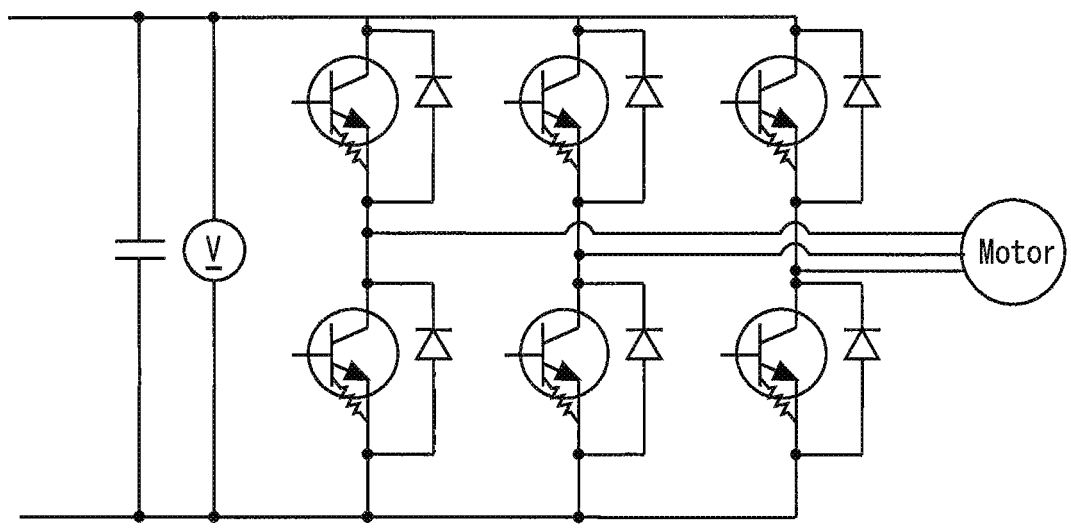
FIG. 6 is a diagram illustrating a power converter according to fourth embodiment.

FIG. 6 is a diagram illustrating a power converter according to fourth embodiment. The power converter includes at least one semiconductor module according to any one of Embodiments 1 to 3. Thus, the insulating layer 12a and the semiconductor chips with the thicknesses described in any one of Embodiments 1 to 3 are formed in at least one portion of the power converter. The power converter illustrated in FIG. 6 includes six switching devices and six freewheeling diodes as semiconductor chips, forming a three-phase inverter circuit as a whole. However, the power converter is not limited to the inverter circuit, and a converter, a servo amplifier, or a power supply unit may be formed.

A power converter may include the semiconductor module, according to any one of Embodiments 1 to 3, featuring a small size, a dense arrangement, and a long service life. Thus, the power converter can have a smaller casing size with less design limitation imposed on a casing and a bus bar of the power converter. Conventionally, the number of control power devices of an inverter has been limited because the arrangement of the semiconductor module to be mounted has been limited due to the casing size of the inverter. In this regard, the semiconductor module according to the present invention can be more freely arranged in the power converter, whereby a larger number of control power devices can be mounted. All things considered, an inverter with an improved function can be achieved.

The technical features described in the embodiments described above can be combined as appropriate to be used.

In the present invention, formation of a crack is prevented in a first metal joining member formed directly below a semiconductor chip, but is tolerated in a second metal joining member below an insulating substrate, formed to be large when a SiC semiconductor chip is used, and thus high heat dissipation can be ensured for the semiconductor chip.

Obviously many modifications and variations of the present invention are possible in the light of the above teachings. It is therefore to be understood that within the scope of the appended claims the invention may be practiced otherwise than as specifically described.

What is claimed is:
1. A semiconductor module comprising:
   an insulating substrate including an insulating layer, a first metal pattern formed on an upper surface of the insulating layer, and a second metal pattern formed on a lower surface of the insulating layer;
   a semiconductor chip that is formed of SiC and is fixed to the first metal pattern with a first metal joining member;
   a heat sink that is fixed to the second metal pattern with a second metal joining member;
   terminals electrically connected to the semiconductor chip; and
   a casing defining an interior opening that accommodates the insulating substrate and the semiconductor chip and is fixed to the heat sink, and each of the terminals has an end positioned at a respective location on the casing within the interior opening, wherein
   the semiconductor chip has a thickness that is equal to or larger than 0.25 mm and equal to or smaller than 0.35 mm,
   a thickness of the insulating layer is in a range of 0.8 mm inclusive to 1.0 mm inclusive,
   no terminals are directly connected to the insulating substrate,
   the second metal joining member includes a directly below portion that is disposed directly below the semiconductor chip and a non-directly below portion that continues to the directly below portion and is not disposed directly below the semiconductor chip, and
   a crack formed in the first metal joining member is smaller than a crack formed in the non-directly below portion.
2. The semiconductor module according to claim 1, wherein a material of the insulating layer is AlN, $Al_2O_3$, or SiN.
3. The semiconductor module according to claim 1, further comprising:

a control IC in which a driving circuit that drives the semiconductor chip and a protection circuit for the semiconductor chip are integrated, wherein the control IC is accommodated in the casing.

4. A power converter comprising at least one semiconductor module including:
- an insulating substrate including an insulating layer, a first metal pattern formed on an upper surface of the insulating layer, and a second metal pattern formed on a lower surface of the insulating layer;
- a semiconductor chip that is formed of SiC and is fixed to the first metal pattern with a first metal joining member;
- a heat sink that is fixed to the second metal pattern with a second metal joining member;
- terminals electrically connected to the semiconductor chip; and
- a casing defining an interior opening that accommodates the insulating substrate and the semiconductor chip and is fixed to the heat sink, and each of the terminals has an end positioned at a respective location on the casing within the interior opening, wherein the semiconductor chip has a thickness that is equal to or larger than 0.25 mm and equal to or smaller than 0.35 mm, a thickness of the insulating layer is in a range of 0.8 mm inclusive to 1.0 mm inclusive, no terminals are directly connected to the insulating substrate, the second metal joining member includes a directly below portion that is disposed directly below the semiconductor chip and a non-directly below portion that continues to the directly below portion and is not disposed directly below the semiconductor chip, and a crack formed in the first metal joining member is smaller than a crack formed in the non-directly below portion.

* * * * *